(12) United States Patent
Padinger

(10) Patent No.: US 8,994,137 B2
(45) Date of Patent: Mar. 31, 2015

(54) SENSOR MATRIX WITH SEMICONDUCTOR COMPONENTS

(75) Inventor: Franz Padinger, St. Marien (AT)

(73) Assignee: ASMAG-Holding GmbH, Grünau im Almtal (AT)

(*) Notice: Subject to any disclaimer, the term of this patent is extended or adjusted under 35 U.S.C. 154(b) by 67 days.

(21) Appl. No.: 12/733,640

(22) PCT Filed: Sep. 15, 2008

(86) PCT No.: PCT/EP2008/007663
§ 371 (c)(1),
(2), (4) Date: Mar. 22, 2010

(87) PCT Pub. No.: WO2009/033728
PCT Pub. Date: Mar. 19, 2009

(65) Prior Publication Data
US 2010/0219408 A1    Sep. 2, 2010

(30) Foreign Application Priority Data
Sep. 13, 2007  (AT) .................. A 1434/2007

(51) Int. Cl.
*H01L 51/00* (2006.01)
*H01L 27/30* (2006.01)
(Continued)

(52) U.S. Cl.
CPC .......... *H01L 51/0024* (2013.01); *H01L 27/307* (2013.01); *H01L 51/441* (2013.01); *H01L 51/5203* (2013.01); *H01L 2251/558* (2013.01); *Y02E 10/549* (2013.01)
USPC ....... 257/443; 257/40; 257/448; 257/E51.012

(58) Field of Classification Search
USPC ............................. 257/40, 443, 448, E51.012
See application file for complete search history.

(56) References Cited

U.S. PATENT DOCUMENTS 3,717,724 A * 2/1973 Montgomery, III .......... 348/272
4,285,007 A * 8/1981 Nakano et al. ................ 348/273
(Continued)

FOREIGN PATENT DOCUMENTS

DE    695 29 512    11/2003
JP    62-122282    6/1987
(Continued)

OTHER PUBLICATIONS

International Search Report.
(Continued)

*Primary Examiner* — Victor A Mandala
(74) *Attorney, Agent, or Firm* — Collard & Roe, P.C.

(57) ABSTRACT

The invention relates to a sensor matrix (1) with semiconductor components and a process for producing such a device, which sensor matrix comprises a laminar carrier layer (3), a first (4) and at least one second (10) electrode arrangement and a component arrangement (6). The first electrode arrangement (4) is disposed on a surface (2) of the carrier layer (3), and the component arrangement (6) is disposed on the first electrode arrangement (4) in the form of a plurality of organic semiconductor components (7). The second electrode arrangement (10) is arranged on a surface (8) of a top layer (9), and the top layer (9) is arranged over the carrier layer (3) so that the first (4) and second (10) electrode arrangements face one another and the second electrode arrangement (10) is in electrically conductive contact, at least in sections, with the component arrangement (6).

16 Claims, 4 Drawing Sheets

Figure 1:
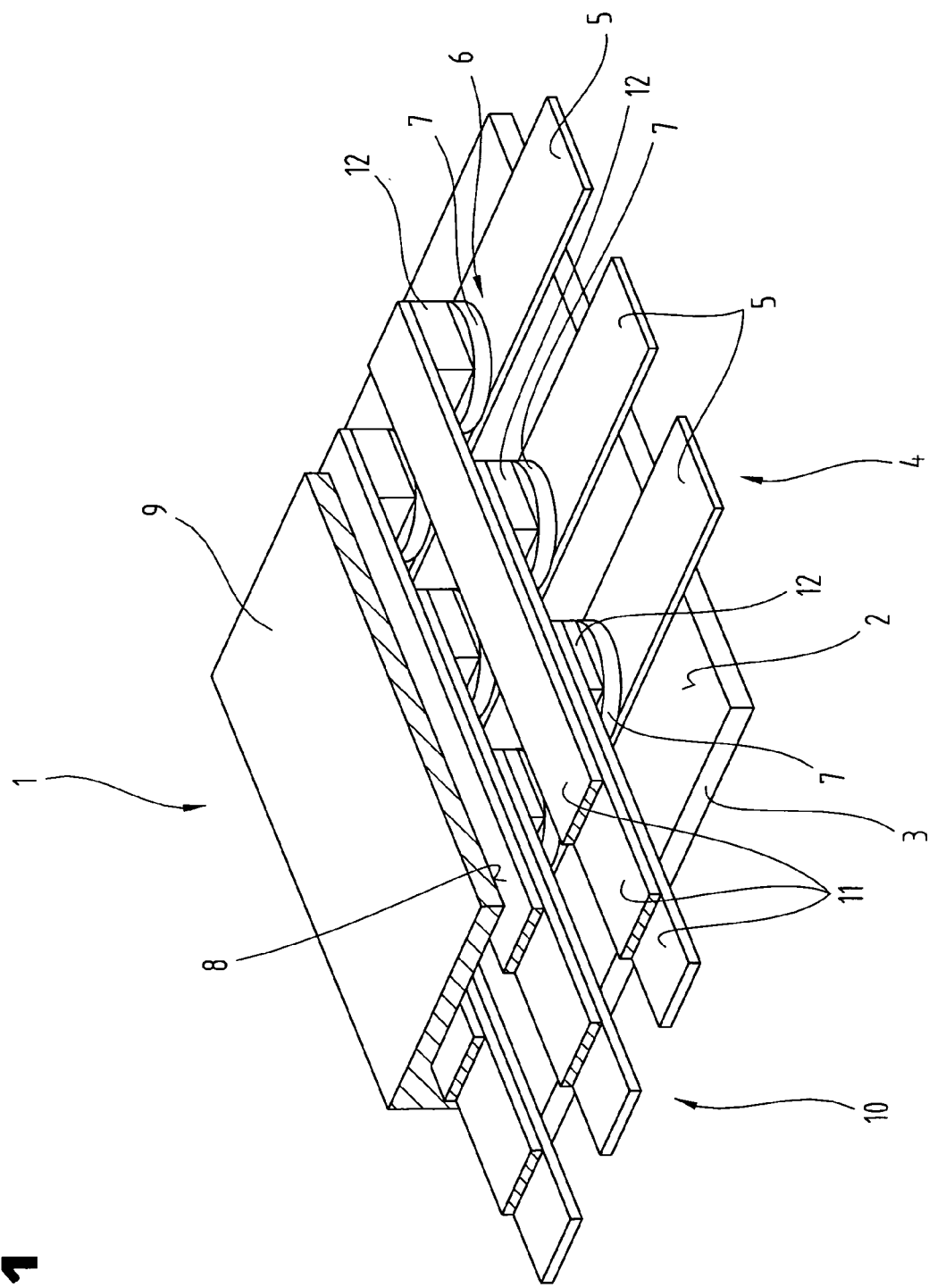

(51) Int. Cl.
*H01L 51/44* (2006.01)
*H01L 51/52* (2006.01)

(56) References Cited

U.S. PATENT DOCUMENTS

| | | | | |
|---|---|---|---|---|
| 4,395,629 | A * | 7/1983 | Sasano et al. | 250/226 |
| 5,705,888 | A | 1/1998 | Staring et al. | |
| 6,303,943 | B1 * | 10/2001 | Yu et al. | 257/40 |
| 6,326,936 | B1 | 12/2001 | Inganas et al. | |
| 7,629,608 | B2 * | 12/2009 | Honda | 257/43 |
| 2002/0020924 | A1 * | 2/2002 | Mueller et al. | 257/778 |
| 2004/0016923 | A1 * | 1/2004 | Yu et al. | 257/49 |
| 2004/0046496 | A1 * | 3/2004 | Mishima | 313/504 |
| 2005/0184650 | A1 * | 8/2005 | Peng et al. | 313/503 |
| 2005/0195318 | A1 * | 9/2005 | Komatsu et al. | 348/370 |
| 2006/0027800 | A1 * | 2/2006 | MacPherson et al. | 257/40 |
| 2008/0035835 | A1 * | 2/2008 | Komatsu et al. | 250/208.1 |
| 2009/0114905 | A1 * | 5/2009 | Ottermann et al. | 257/40 |

FOREIGN PATENT DOCUMENTS

| | | | |
|---|---|---|---|
| JP | 10-255976 | 9/1998 | |
| JP | 2005-327943 | 11/2005 | |
| WO | WO 96/08047 | 3/1996 | |
| WO | WO 99/39394 | 8/1999 | |
| WO | WO 01/43870 | 6/2001 | |
| WO | WO2006-112537 * | 10/2006 | 51/40 |
| WO | WO 2006/112537 | 10/2006 | |

OTHER PUBLICATIONS

Written Opinion of the International Searching Authority.
Anonymous, "Introduction to Printed Semiconductors," Nanoident Technologies AG Whitepaper, [online] Mar. 2007, pp. 1-11, XP-002513758, retrieved from the Internet: URL: http://www.nanoident.com/images/stories/technology/whitepaper_ofab.pdf [retrieved on Feb. 4, 2009] "Basic structure of the NANOIDENT organic photodiode array" (ISR).

* cited by examiner

SENSOR MATRIX WITH SEMICONDUCTOR COMPONENTS

CROSS REFERENCE TO RELATED APPLICATIONS

This application is the National Stage of PCT/EP2008/007663 filed on Sep. 15, 2008, which claims priority under 35 U.S.C. §119 of Austrian Application No. A 1434/2007 filed on Sep. 13, 2007. The international application under PCT article 21(2) was published in English.

The invention relates to a sensor matrix with semiconductor components, comprising a laminar carrier layer, a first and at least one second electrode arrangement, and a component arrangement, which component arrangement is disposed on the first electrode arrangement and is embodied with a plurality of semiconductor components, and the semiconductor components are embodied with an organic semiconductor material and the first electrode arrangement is arranged on a surface of the carrier layer. The invention further relates to a process for producing a sensor matrix, which comprises the steps of printing a first electrode arrangement onto a surface of a carrier layer; printing a component arrangement onto the first electrode arrangement; and at least in sections printing contact sections onto the component arrangement.

Components or sensors in a matrix- or gridlike arrangement must be supplied with energy and must transfer identified measurement values or parameters from the sensors and/or components to the outside, for instance to a readout device. With known devices, the source and drain electrodes are typically arranged on the carrier layer between the sensors and components, where due to the typically high integration density, there is normally only a very small space available for them. If the sensors are arranged for example in a geometric grid, a grid-like arrangement of the supply and readout electrodes is typically used; the electrodes are then typically referred to as column and row electrodes. In order to be able to access an individual component of the matrix arrangement, an additional selectively controllable switching device is required, in order for example to electrically connect one component to at least one column- and one row electrode. Especially for a sensor matrix with a very high component density, known devices have the disadvantage that the supply and readout electrodes must be arranged very densely packed on the carrier layer. Because of the minimal distance between electrodes, it is easy for signals from the electrodes to interfere with one another—in particular, so-called crosstalk is possible. In this case, the signal to be measured or captured by one electrode is influenced or distorted by the signal from another, particularly a neighboring, electrode. With a sensor arrangement to capture optical signals, this situation can result in the captured image being unusable, because the crosstalk can lead to blurring of the captured contours. In particular, the known embodiment is always a disadvantage In situations where a high resolution of captured parameters is required and where, because of the nature of the affected signal, locally confined large differences in the affected signal level can occur.

The objective of the invention is to improve a matrix-like or gridlike component arrangement so that the problem of crosstalk is reduced and at the same time a simplified construction and production is possible.

The objective of the invention is solved in that the second electrode arrangement is arranged on a surface of a top layer and the top layer is arranged over the carrier layer, where the first and second electrode arrangements face one another and the second electrode arrangement has an electrically conductive contact with the component arrangement, at least in sections.

This embodiment has the particular advantage that the electrical contact of the component arrangement through the first and second electrode arrangement means that more space is available and thus the danger of crosstalk between the electrode arrangements is significantly reduced.

The embodiment has the further advantage that the carrier layer and the top layer, each as necessary with further layers or elements arranged on them, can be manufactured separately from one another and that the sensor matrix according to the invention is formed by an electrically conductive contact of the component arrangement to the second electrode arrangement, at least in sections.

To simplify the description, the features carrier layer and top layer refer not only to the individual parts, but also to all further layers or elements applied to them. In this way, the carrier layer for example also comprises the applied first electrode arrangement and the component arrangement. To the person skilled in the art, it is in this way clear which feature applies in the description of an advantageous further embodiment.

Of particular advantage is an embodiment in which the sensor matrix is elastically deformable and re-formable. This embodiment enables the sensor matrix to be applied to uneven surfaces or onto dynamically deformable surfaces on the one hand. Furthermore, this embodiment makes it possible to use production processes and methods with which for instance the carrier layer and/or the top layer can be shaped. It would be understood by the person skilled in the art that the elastically deformable and re-formable shaping remains within material-specific boundaries, so that the deformation does not lead to irreversible material damage.

This embodiment does not exclude that the carrier layer and/or the top layer are embodied with a rigid material. According to a further embodiment, the top layer can for example be embodied with a printed circuit board, where in this embodiment the carrier layer is arranged on the top layer.

One embodiment, in which the first and/or second electrode arrangement is embodied with at least one electrically conductive electrode each, has the advantage that it enables a targeted selection of resolution capability through the appropriate embodiment of the electrode arrangements. For instance it is possible, through different quantities or different structuring of the electrodes of the first and/or second electrode arrangement, to take measurements at multiple resolutions at the same time.

Also, the components of the component arrangement can feature more than two electrical contact points, and an electrical contact is possible as a result of this advantageous embodiment.

According to a further embodiment, the electrodes of the first and/or second electrode arrangement are embodied as strip electrodes. The advantage of a strip electrode is that because of the specific width in the direction of the surface of the carrier layer and perpendicular to its longitudinal extension, it easily allows the desired resolution to be obtained. In particular, it is possible to adjust the width of the electrode specifically to suit the semiconductor components to be applied. A thin strip electrode can be specifically widened in any section onto which a semiconductor component will be arranged, for example. The advantage if this embodiment is that the strip electrode takes up only the minimal surface area required to transmit the electrical signal.

Another advantageous embodiment is one in which the semiconductor component is provided in the form of an electromagnetic radiation detector and/or as an electromagnetic radiation source. This option makes it possible to use a number of different electronic semiconductor components in the sensor matrix according to the invention.

In other advantageous embodiments, it is possible to use the arrangement described in the invention for all component arrangements in which an electronic component must be electrically contacted, resulting in the least possible mutual influence, which is for instance required for the drain electrode.

According to a preferred embodiment, the electromagnetic radiation detector is provided in the form of a photodiode or a CCD element. In another particularly advantageous embodiment, the radiation detector is an organic semiconductor component with an organic photodetector, for example. Another equally advantageous embodiment is one in which the electromagnetic radiation source is embodied with an OLED.

An embodiment in which an electrically conductive contact area is applied to the semiconductor component at least in sections has the advantage that for each semiconductor component, it provides at least one uniquely identified section, designed for producing an electrically conductive contact.

This contact area can be provided by means of a metal for instance, but another embodiment is possible in which the contact area is provided by means of an electrically conducive, transparent or semitransparent material, for example indium tin oxide (ITO). In particular, all TCOs (Transparent Conductive Oxides) as well as all conductive polymers can be used to provide the contact area. The contact area can also serve as a means of providing increased mechanical protection for the semiconductor component for example.

Another advantageous embodiment is one in which a protective layer is disposed at least in sections over the component arrangement. This embodiment makes it possible to seal the semiconductor component and the component arrangement against environmental influences. This protective layer may also serve as a means of selectively altering the mechanical properties of the sensor matrix according to the invention, with respect to its elasticity for example. For instance, the carrier layer and/or the top layer could be embodied with a film-like material and the elasticity of the sensor matrix can be selected as a function of the mechanical properties of the protective layer. In another advantageous embodiment, the protective layer may also have particular surface properties which advantageously simplify the application of an additional layer, for instance. The protective layer may also be selected so that it largely compensates for the various surface structures of the carrier or top layer, so that the arrangement of the top over the carrier layer does not result in any undesired deformation of the electrode arrangement.

If the protective layer is electrically nonconductive, then in an advantageous manner no additional electrical isolation of the first and/or second electrode arrangement is required. An electrically isolating protective layer has the further advantage of affording a reliable electrical isolation of the individual semiconductor components in the component arrangement.

Of particular advantage is an embodiment in which the carrier layer and/or the top layer are transparent or semitransparent, preferably in the optically visible wavelength range. Since, according to another advantageous embodiment, a semiconductor component may be provided with an electromagnetic radiation detector or radiation source that is preferably functional in the optically visible range for example, the claimed embodiment enables unhindered entrance or emission of electromagnetic radiation to or from the semiconductor component. The embodiment has another advantage in that it allows the sensor matrix according to the invention to be easily integrated in other devices.

According to another advantageous embodiment, the first and/or second electrode arrangement is transparent or semitransparent. This embodiment is also advantageous in that it enables unhindered light entry or light emission. Light here refers to any range of electromagnetic radiation that lies within the optical wavelength range, and in particular includes the visible optical range. Transparent or semitransparent electrode arrangements may be provided by means of TCOs (Transparent Conductive Oxides) such as for instance indium tin oxide (ITO), zinc oxide (ZnO), tin (x) oxide (SnxO), but an embodiment with a material from the group comprising conductive polymers such as PEDOT (poly(3, 4ethylenedioxythiophene)), PANI (polyaniline) is also possible. Thin metal layers such as gold layers, with a layer thickness of less than 30 nm, are also good electrical conductors and are also semitransparent.

Electrodes of the first and/or second electrode arrangement embodied at least in sections as electrically isolating have the particular advantage that they can be arranged on top of one another, without the risk of an electrical short circuit. The electrical isolation may be provided in the form of an isolation layer applied to the electrodes; in this way each electrode is electrically isolating. The electrode arrangement may also comprise an alternating arrangement of an electrode and an isolating layer. In this way, a layered arrangement is obtained with electrodes electrically isolated from one another.

An embodiment with which the semiconductor components in the component arrangement are arranged electrically isolated from one another on the first electrode arrangement makes it possible to insert several semiconductor components, each with its own function, without the risk of an electrical short circuit. This embodiment has the further advantage that it also minimizes any mutual influence between the individual semiconductor components, in particular the captured measurement values.

According to another advantageous embodiment, the strip electrodes of the first and second electrode arrangements are disposed such that their longitudinal extensions are offset from one another in rotation. Preferably, the strip electrodes are offset from one another by 90°, which has the particular advantage or producing a grid-like arrangement of column and row electrodes. The embodiment has another advantage in that the rotated arrangement reduces the mutual influence between the electrode arrangements.

An embodiment in which electrically conductive contact points are arranged at least in sections on the electrodes of the second electrode arrangement has the advantage that it has distinctly defined sections in which an electrical contact exists between the second electrode arrangement and the component arrangement.

A particularly advantageous embodiment is obtained if the contact points of the second electrode arrangement are in electrically conductive contact with the semiconductor components in the component arrangement or the contact surfaces on the semiconductor components. With this embodiment, the electrical contact of the semiconductor components occurs in defined sections. In particular this ensures that no unintended electrical contact is made with additional semiconductor components.

In particular, this embodiment enables the carrier layer and the top layer to be produced separately, including all additionally applied layers. With the defined electrical contact points, the arrangement of the top layer over the carrier layer provides a reliable electrical contact.

A decisive advantage is obtained due to the fact that the carrier layer and the top layer are connected to one another at least in sections. With this embodiment, two subcomponents produced separately from one another are connected together into a functional sensor matrix, and as a result of the described improvement to these embodiments, a defined electrical contact is established between the second electrode arrangement and the component arrangement.

To evaluate the measurement values captured from the semiconductor components, it is advantageous if a readout device is provided, which is electrically connected to the first and/or second electrode arrangement. The task of selecting the individual semiconductor components, as well as the electrical connection of the selected components to an external evaluation device, is thus advantageously taken over by the readout device. Since a sensor matrix according to the invention comprises at most a number of individual semiconductor components, this embodiment is of particular advantage because, as claimed, only a considerably smaller number of interconnects must lead from the sensor matrix to the external evaluation device.

An embodiment in which the first electrode arrangement is printed onto previously applied layers on the surface of the carrier layer and/or the component arrangement and/or the contact section has the particular advantage that the claimed sensor matrix can be produced especially cost effectively and efficiently. Another advantage of using a printing process to apply layers, for instance a process from the group comprising inkjet, flat printing, gravure, or screen printing processes, is that this process does not require a complex work environment. Furthermore, printing processes allow an especially simple, fast, and flexible tailoring or altering of the structure of the electrode arrangements to be produced. The embodiment also enables continuous production of the sensor matrix, for instance in a continuous feed process.

Also of advantage is an embodiment in which the second electrode arrangement is printed on the surface of the top layer and the contact points are printed on the second electrode arrangement. The advantageous properties of the layers produced by printing have already been described.

The objective of the invention is also solved through a process whereby a second electrode arrangement is printed on a surface of a top layer and contact points are printed at least in sections on the second electrode arrangement, and the top layer is arranged over the carrier layer, such that the contact points of the second electrode arrangement come in electrical contact with the contact section of the semiconductor component in the component arrangement, and the top layer is connected to the carrier layer.

The particular advantage of this embodiment is that the carrier and top layer can be produced separately from one another and can then be connected to one another in the claimed process step, and the contact points of the second electrode arrangement create an electrically conductive contact with the component arrangement.

The advantages of using printing processes to produce electronic circuits or components have already been described. It is essential that the printed structure to be produced can be easily tailored to different requirements.

If, in order to bind the cover and carrier layer, a vacuum is created in the space between the cover and carrier layer, then the cover and carrier layer can be connected to one another without intervention by an external force. With expediently selected properties of the surface of the top and carrier layer, they will remain connected to one another after a return to normal air pressure. In particular, this embodiment has the advantage that both layers can be easily fit to existing structures.

According to another advantageous embodiment, the carrier or top layer may also be provided in the form of a rigid printed circuit board, for example. By creating a vacuum in the intermediate space, the cover or carrier layer can fit especially well onto the existing surface structures, thereby resulting in a good electrical contact between the second electrode arrangement and the component arrangement.

As claimed, the carrier layer is connected to the top layer by applying an adhesive binding agent, at least in sections. Applying the binding agent to certain sections only will produce a sufficient connection of the carrier layer to the top layer, without significantly reducing the flexibility of the sensor matrix.

A thermal process for connecting the carrier to the top layer at least in sections has the advantage that it results in a very intimate connection of the materials and can thus provide very high mechanical flexibility. Along with heated connection tools, for instance stamps, processes are also possible whereby, absorption of a physically active variable causes the interior of the material to be heated, thereby joining the carrier and the top layer. For instance, this can be performed using ultrasound or high frequency binding processes.

One particularly advantageous approach to connecting the carrier layer to the top layer is to connect the two to one another during a continually running continuous feed process. This advantageous embodiment enables continuous and thus especially cost-effective and fast production of the sensor matrix according to the invention. In particular, an endless production of the sensor matrix is possible, which could packaged on a roll in other processing steps for specific applications, for instance.

The invention will be explained in more detail below with reference to examples of embodiments illustrated in the appended drawings.

Figure 2:
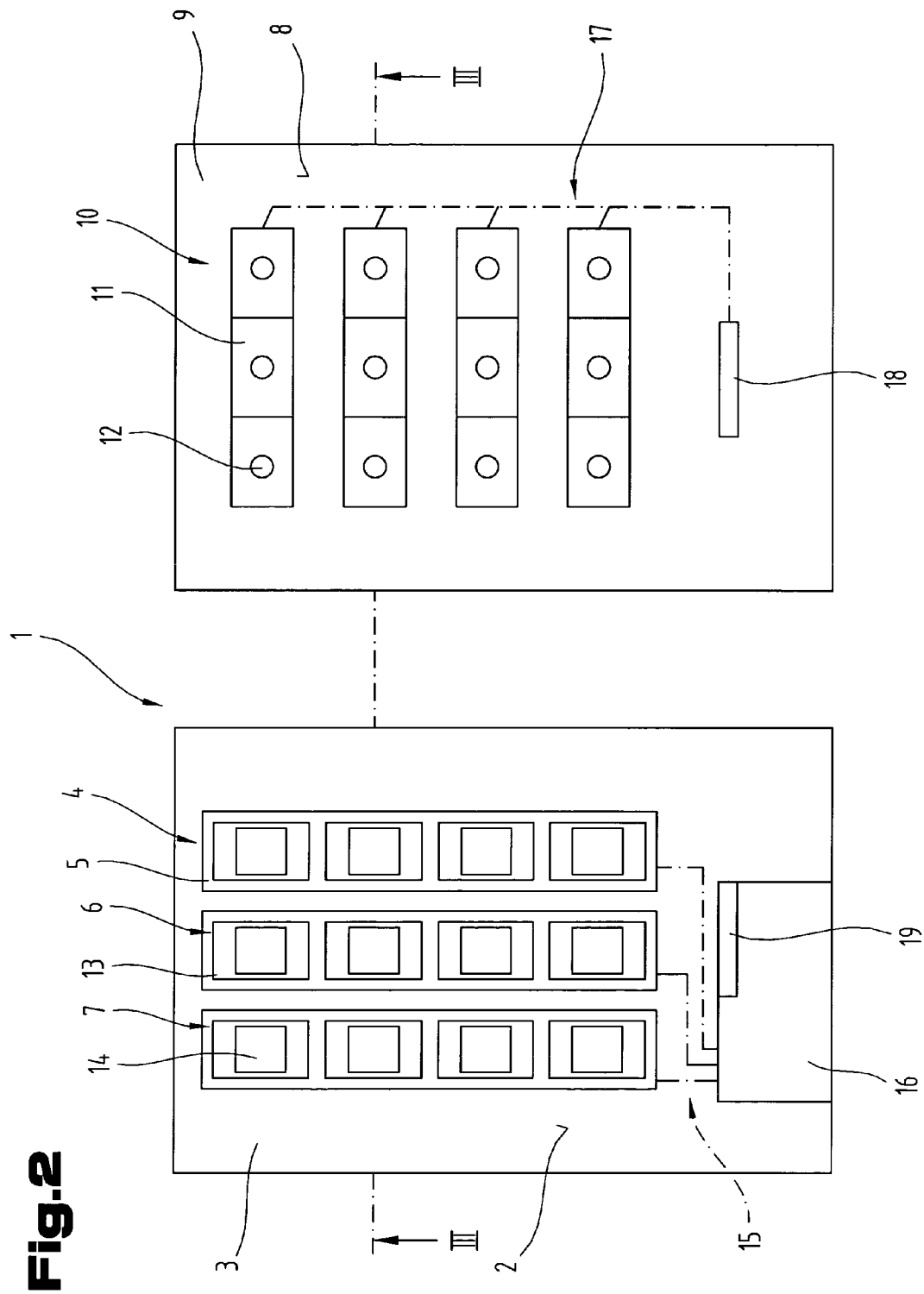
Figure 3:
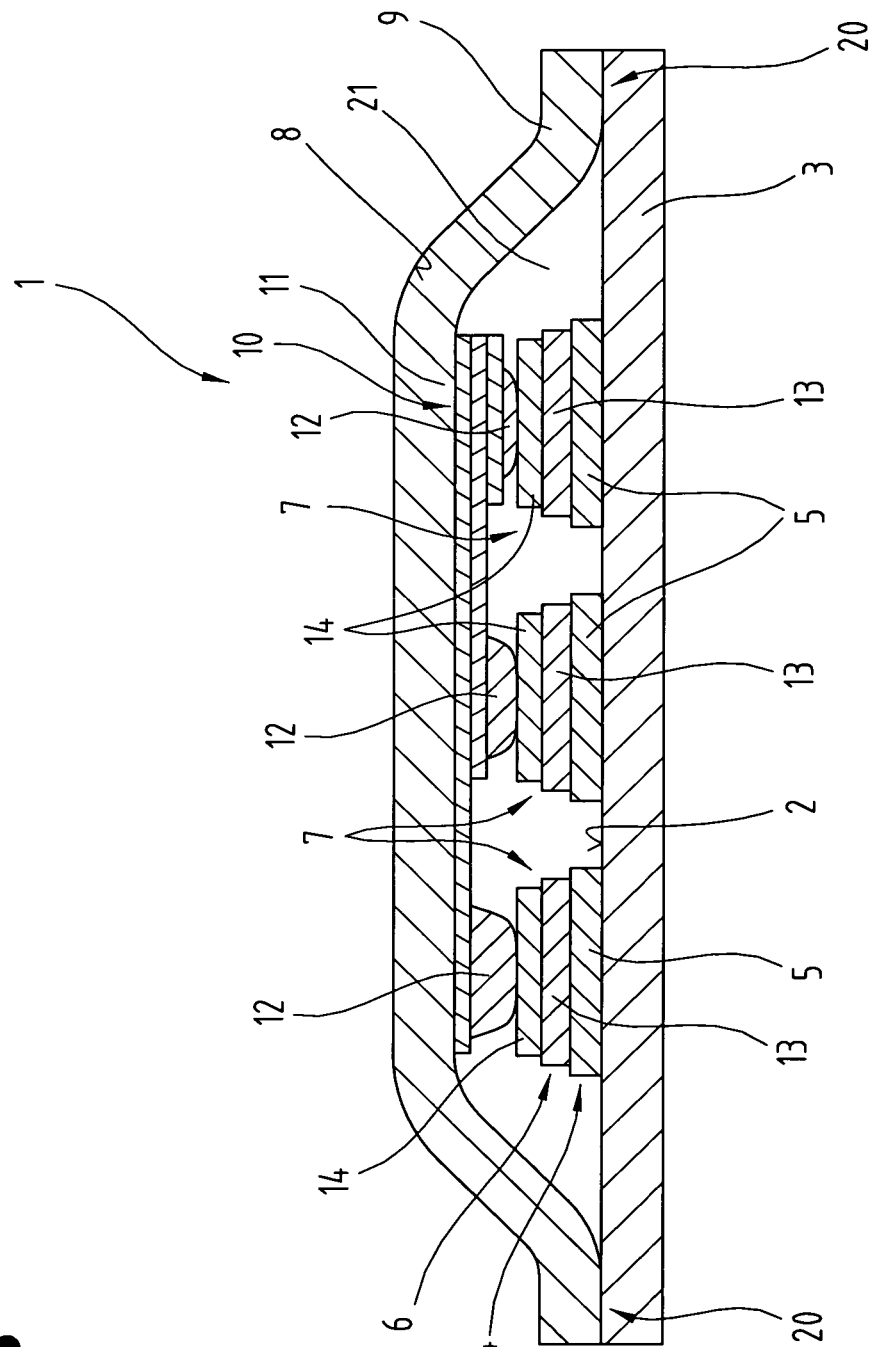
Figure 4:
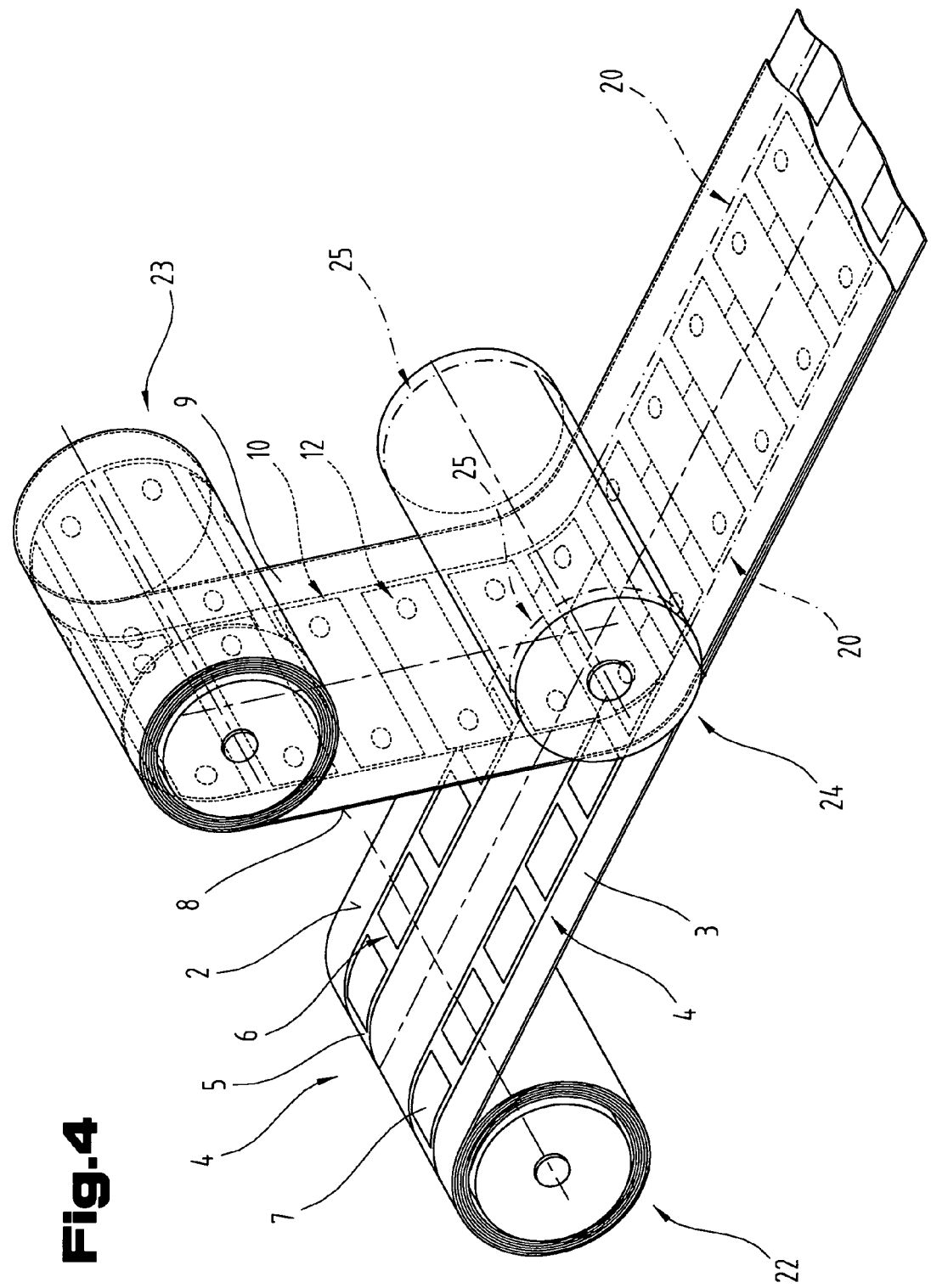

The drawings show:

FIG. 1 a sectional view of the sensor matrix according to the invention;

FIG. 2 an exploded top view of the sensor matrix to show the carrier and top layer;

FIG. 3 a cross section of the sensor matrix, where the carrier and top layer are connected to one another;

FIG. 4 an example of a device for continuous production of the sensor matrix according to the invention.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc., relate to the drawing specifically being described and can be transposed in terms of meaning to a new position when another position is being described. Individual features or combinations of features from the different embodiments illustrated and described may be construed as independent inventive solutions or solutions proposed by the invention in their own right.

FIG. 1 shows the sensor matrix 1 according to the invention in an exploded sectional view. A first electrode arrangement 4 is applied to one surface 2 of the carrier layer 3.

The first electrode arrangement 4 is provided in the form of several strip electrodes 5 electrically isolated from one another. Disposed on the electrodes 5 of the first electrode arrangement 4 is the component arrangement 6. The component arrangement 6 comprises several components 7 electrically isolated from one another. Each of these components 7 comprises at least one semiconductor component and an electrically conductive contact section. The second electrode arrangement 10 is applied to one surface 8 of the top layer 9. The first electrode arrangement 10 comprises several strip electrodes 11 electrically isolated from one another. Each individual strip electrode 11 is disposed so that a contact point 12 applied to the electrode comes into precise contact with the electrically conductive contact section of the component 7 when the carrier layer 3 and the top layer 9 are connected The carrier layer 3 is preferably a flexible, film-like material, for example with an organic material such as polyethylene terephthalate (PET) or polyethylenenaphtalate (PEN). The advantage of a carrier layer of this type is that it is elastically deformable and re-formable, and it is assumed that the person skilled in the art is aware of the maximum allowable strain. On the) surface 2 of the carrier layer 3, multiple strip electrodes are applied by means of a printing process, for instance with inkjet, flat printing, gravure, or screen printing processes. The component arrangement 6 applied to the electrode arrangement 4 is preferably embodied with a plurality of photosensitive sensors, for instance a plurality of CCD sensors. In particular, however, a number of different semiconductor components would be suitable for producing the component arrangement. In particular, the sensor matrix according to the invention may be used for all known component arrangements in which a plurality of semiconductor components are arranged in a gridlike pattern and where a minimal mutual influence of the captured measurement values is required and especially if there is a risk of mutual influence.

If the component arrangement 6 is provided with semiconductor components that are optically active or sensitive to an optical influence, it is of advantage if the carrier layer 3 and the first electrode arrangement 4 are transparent or semitransparent. The electrodes 5 may be formed by means of TCOs (Transparent Conductive Oxides) such as indium tin oxide (ITO), but also with a metal layer up to 30 nm thick, such as gold, thereby resulting in an electrically conductive, semitransparent electrode.

The electrodes 11 of the second electrode arrangement 10 are electrically isolated from one another. This electrical isolation may be achieved by applying an electrical isolation layer to each of the electrodes, for instance. It is also possible to apply the electrodes to the surface 8 of the top layer 9 in such a way, preferably with a printing process, that an electrically isolating layer is printed onto each electrode, and the electrically conductive electrodes and electrically isolating layers together form a layered construction. At least one section of each electrode, however, is not covered with an electrical isolation layer, because in this section an electrically conductive contact point 12 is applied, again preferably with a printing process.

Due to an appropriate layout of the sensor matrix and targeted control of the printing process, the second electrode arrangement 10 and in particular the contacts point 12 applied to it are precisely positioned so that in the subsequent connecting of carrier layer 3 and top layer 9, the contact sections connect with the components 7. The particular advantage of this is that the carrier and top layer can be produced separately from one another and particularly, that they can be made by two different manufacturers.

To achieve a flexible and elastically deformable and re-formable sensor matrix, the top layer is also made from an elastic material, such as PET or PEN. In another advantageous embodiment, the top layer 9 may also be made from a rigid flat material, such as a printed circuit board. With such an embodiment, the carrier layer 3 is connected to the first electrode arrangement 4 applied to it, and the component arrangement 6 is connected to the carrier layer 9, and the flexible and elastically deformable and re-formable carrier layer can be readily adapted to the surface structure of the surface 8 and the layers applied to it.

The carrier layer and top layer may be connected b means of an adhesive binding agent applied to certain sections of a surface 2, 8. By creating a sealed air space between the carrier layer and top layer and subsequently creating a reduced air pressure in this space, it is also possible to connect the two layers permanently.

FIG. 2 shows a plan view of the carrier 3 and the top layer 9, with the sensor matrix 1 according to the invention shown in an exploded manner for simplified representation.

A first electrode arrangement 4 is applied to the surface 2 of the carrier layer 3. The first electrode arrangement 4 is provided in the form of strip electrodes 5 electrically isolated from one another, to which a component arrangement 6 is applied. The semiconductor components 13 of the component arrangement 6 are arranged on the electrodes 5 electrically isolated from one another and have an electrically conductive contact section 14 on their surfaces. The electrodes are connected via electrically conductive interconnects 15 to a readout device 16. The second electrode arrangement 10 is applied to the surface 8 of the top layer 9, and the electrode arrangement 10 is provided in the form of a plurality of strip electrodes 11 electrically isolated from one another. Applied to a section of each strip electrode 11 Is an electrically conductive contact point 12. The electrodes may be connected by interconnects 12 electrically isolated from one another to a contact area 18 for instance, and to simplify the drawing the interconnects 17 are only shown schematically. When the carrier layer is connected to the top layer, the contact area 18 comes into electrically conductive contact with the contact area 19 of the readout device 16 and thus creates a connection between the second electrode arrangement 10 and the readout device 16. In another embodiment, a readout device may also be disposed on the top layer 9, in which case the readout devices of the carrier layer and top layer can be connected to an external evaluation unit, for instance by a detachable contact device.

FIG. 3 shows a cross section of the sensor matrix 1 according to the invention, along the section indicated in FIG. 2, but with the carrier and top layer connected to one another. A first electrode arrangement 4 is applied to a surface 2 of the carrier layer 3 In the form of multiple strip electrodes 5. The component arrangement 6 is applied to the first electrode arrangement 4, which is provided in the form of several semiconductor components 13. An electrically conductive contact section 14 is applied to at least certain sections of each semiconductor component 13. The second electrode arrangement 10 is applied to the surface 8 of the top layer 9 in the form of a plurality of strip electrodes 11, and the individual strip electrodes 11 are electrically isolated from one another. Applied to the electrodes 11 are electrically conductive contact points 12, which establish an electrically conductive contact with the contact sections 14 of the components 7.

To simplify the diagram, the electrical interconnects 17 are not shown in the drawing. The person skilled in the art would understand how the interconnects are applied to and disposed on the top layer 9 in order to create an electrically conductive connection between the electrodes 11 of the second electrode arrangement 10 and the contact area.

The carrier layer and top layer may be connected by pressing the two layers against one another in a contact area 20 for example, and a reduced air pressure is generated in the space 21. With appropriately selected surface properties in the contact area 20 of the surfaces 2 and 8, both layers are then permanently connected to one another. If necessary, a binding agent may be applied to the surfaces in the contact area 20, for instance an adhesive binding agent, in order to reinforce the connection of the two layers. It is also possible to connect the carrier layer and cover layer at least in sections in a plurality of contact areas 20, without affecting the printing conditions in the space 21. For instance, processes activated by thermal or electromagnetic radiation could be used to connect the two layers, and electro-acoustic connection processes are also possible.

Another embodiment is possible where only a temporary connection of the carrier and top layer is desired, for instance for a functional test.

As illustrated in the drawing, the top layer 9 is adapted to the surface structure of the carrier layer 3. It is also possible for the carrier layer 3 to be adapted to the surface structure of the top layer 9, for example if the top layer 9 is provided in the form of a printed circuit board. With the advantageous properties of the sensor matrix according to the invention whereby the top layer and carrier layer can be produced separately from one another, both the carrier layer and top layer can be optimally adjusted to one another.

FIG. 4 shows an example of a device for connecting the carrier layer 3 to the top layer 9. The first electrode arrangement 4 as well as the component arrangement 6 are applied to the carrier layer 3 in a first work step. The carrier layer is supplied by means of a feeder device 22.

In previous work steps, the second electrode arrangement 10 as well as the contact points 12 could also be applied to the top layer 9 and also fed by means of a feeder device 23.

A connection device 24 brings the carrier layer 3 into contact with the top layer 9, and a binding agent 25 creates a connection between the carrier layer 3 and the top layer 9 in a contact area 20, for example.

In the figure, a device for connecting two film-like layers is shown. In another advantageous embodiment, one of the two layers may also be provided in the form of a printed circuit board for example, which is connected to the top layer or carrier layer.

However, the sensor matrix according to the invention is not restricted to the embodiments illustrated; in particular the invention encompasses all embodiments with which a plurality of semiconductor components that are preferably in a gridlike arrangement must be contacted.

All figures relating to ranges of values given in the substantive description should be construed as meaning that they include any and all part-ranges, e.g. the range 1 to 10 should be understood as meaning that it includes all part-ranges starting from the lower limit of 1 and up to the upper limit of 10, i.e. all part-ranges start with a bottom limit of 1 or higher and end with an upper limit of 10 or less, e.g. 1 to 1.7, or 3.2 to 8.1, or 5.5 to 10.

The embodiments illustrated as examples represent possible design variants of the sensor matrix according to the invention, and it should be pointed out at this stage that the invention is not specifically limited to the design variants specifically illustrated, and instead the individual design variants may be used in different combinations with one another and these possible variations lie within the reach of the person skilled in this technical field given the disclosed technical teaching. Accordingly, all conceivable design variants that can be obtained by combining individual details of the design variants described and illustrated are possible and fall within the scope of the invention.

As a matter of form, for better understanding of the construction of the sensor matrix, it and its components may be partially illustrated not to scale and/or enlarged and/or reduced.

The underlying objective of the independent solutions proposed by the invention may be found in the description.

The individual embodiments illustrated in FIGS. 1 to 4 may be construed as independent solutions proposed by the invention in their own right. The objectives and solutions proposed by the invention fall may be found in the detailed description of these drawings.

LIST OF REFERENCE NUMBERS

1 Sensor matrix
2 Surface
3 Carrier layer
4 First electrode arrangement
5 Electrode
6 Component arrangement
7 Surface
8 Component
9 Top layer
10 Second electrode arrangement
11 Electrode
12 Contact point
13 Semiconductor component
14 Contact section, contact area
15 Interconnects
16 Readout device
17 Interconnects
18 Contact area
19 Contact area
20 Contact area
21 Space
22 Feeder device for carrier layer
23 Feeder device for carrier layer
24 Connection device
25 Binding agent

The invention claimed is:

1. A sensor matrix with semiconductor components, the sensor matrix being elastically deformable and re-formable and comprising
  a laminar flexible film-shaped carrier layer and top layer,
  a first and at least one second electrode arrangement, and
  a component arrangement,
  wherein the first electrode arrangement is disposed on a flat surface of the carrier layer and wherein the first electrode arrangement is provided as electrically conductive electrodes,
  wherein the component arrangement is provided in the form of a plurality of semiconductor components made from an organic semiconductor material,
  wherein the component arrangement is disposed on the first electrode arrangement such that several semiconductor components share a common electrode of the first electrode arrangement, wherein the second electrode arrangement is disposed on a flat surface of the top layer and where the second electrode arrangement comprises electrically conductive electrodes, wherein the electrodes are electrically isolated from each other and are, without fully overlapping, arranged on top of each other, thus defining an electrically conductive contact section for each electrode of the second electrode arrangement,
  wherein electrically conductive contact points are set onto the contact sections of the electrodes of the second electrode arrangement, and when the top layer is disposed over the carrier layer, such that the flat surface of the top layer is oriented towards the flat surface of the carrier layer, each semiconductor component is connected via a respective contact point to an electrode of the second electrode arrangement, and the carrier layer and the top layer are in contact in a contact area only.

2. The sensor matrix according to claim 1, wherein the electrodes of the first and/or second electrode arrangement are provided in the form of strip electrodes.

3. The sensor matrix according to claim 1, wherein the semiconductor component is provided in the form of an electromagnetic radiation detector and/or as an electromagnetic radiation source.

4. The sensor matrix according to claim 1, wherein an electrically conductive contact area is applied to at least sections of the semiconductor component.

5. The sensor matrix according to claim 1, wherein a protective layer is disposed on at least certain sections over the component arrangement.

6. The sensor matrix according to claim 1, wherein the protective layer is electrically nonconductive.

7. The sensor matrix according to claim 1, wherein the carrier layer and/or the top layer is transparent or semitransparent.

8. The sensor matrix according to claim 1, wherein at least one of the first and second electrode arrangements is provided in the form of transparent or semi-transparent electrodes.

9. The sensor matrix according to claim 1, wherein the electrodes of the first electrode arrangement are electrically isolated at least in sections.

10. The sensor matrix according to claim 1, wherein the semiconductor components of the component arrangement disposed on the first electrode arrangement are electrically isolated from one another.

11. The sensor matrix according to claim 2, wherein the strip electrodes of the first and second electrode arrangements are arranged such that their longitudinal extensions are rotated offset from one another.

12. The sensor matrix according to claim 1, wherein the contact points contact the semiconductor components of the component arrangement or the contact surfaces arranged on the semiconductor components in an electrically conductive manner.

13. The sensor matrix according to claim 1, wherein the carrier layer and/or the top layer are connected to one another, at least in sections.

14. The sensor matrix according to claim 1, wherein a readout device is provided, which is electrically connected to the first and/or second electrode arrangement through interconnects.

15. The sensor matrix according to claim 1, wherein the first electrode arrangement is printed on the surface of the carrier layer and/or the component arrangement and/or the contact section onto already applied layers.

16. The sensor matrix according to claim 1, wherein the second electrode arrangement is printed onto the surface of the top layer and the contact points are printed onto the second electrode arrangement.

* * * * *